US007766510B2

(12) United States Patent
Lee

(10) Patent No.: US 7,766,510 B2
(45) Date of Patent: Aug. 3, 2010

(54) COOLING STRUCTURE FOR STREET LAMP USING LIGHT EMITTING DIODE

(75) Inventor: Young Seb Lee, Daegu-si (KR)

(73) Assignee: Korea Semiconductor Illumination Co., Ltd. (KR)

( * ) Notice: Subject to any disclaimer, the term of this patent is extended or adjusted under 35 U.S.C. 154(b) by 0 days.

(21) Appl. No.: 12/218,770

(22) Filed: Jul. 17, 2008

(65) Prior Publication Data

US 2009/0046458 A1 Feb. 19, 2009

(30) Foreign Application Priority Data

Aug. 13, 2007 (KR) .................. 10-2007-0081069
May 15, 2008 (KR) .................. 10-2008-0044913

(51) Int. Cl.
*F21V 29/00* (2006.01)

(52) U.S. Cl. ............... 362/249.02; 362/800; 362/431; 362/294; 362/373

(58) Field of Classification Search ................. None
See application file for complete search history.

(56) References Cited

U.S. PATENT DOCUMENTS

2006/0215416 A1* 9/2006 Lucas et al. ............... 362/545
2007/0070628 A1* 3/2007 Chen ......................... 362/249
2007/0109788 A1* 5/2007 Pan ........................... 362/294
2008/0013320 A1* 1/2008 Tain et al. .................. 362/294
2008/0106892 A1* 5/2008 Griffiths et al. ............ 362/223

\* cited by examiner

*Primary Examiner*—Laura Tso
(74) *Attorney, Agent, or Firm*—Sofer & Haroun, LLP

(57) ABSTRACT

Provided is a cooling structure for a street lamp using light emitting diodes. The cooling structure comprises a heat-dissipating case having an installation portion therein, a printed circuit board installed within the installation portion, one or more light emitting diodes installed under the printed circuit board, a heat transfer unit for transferring heat to be generated from the light emitting diodes to the top of the heat-dissipating case and dissipating the heat to the outside, and reflection plates disposed at the bottom of the heat-dissipating case. The cooling structure is efficiently improved to quickly and rapidly dissipate heat generated from the light emitting diodes during turn-on. With this configuration of the cooling structure, the street lamp is protected from failure and has greatly improved durability. In addition, the light emitting structure is improved to inhibit loss of luminance. Therefore, the energy efficiency of the street lamp can be effectively improved.

14 Claims, 2 Drawing Sheets

COOLING STRUCTURE FOR STREET LAMP USING LIGHT EMITTING DIODE

RELATED APPLICATION

This application claims the benefit of priority from Korean Patent Application Nos. 10-2007-0081069, filed on Aug. 13, 2007 and Korean Patent Application No. 10-2008-0044913, filed on May 15, 2008, the entirety of which are incorporated by reference.

BACKGROUND OF THE INVENTION

1. Field of the Invention

The present invention relates to a cooling structure for a street lamp using light emitting diodes (hereinafter, also referred to simply as an 'LED street lamp'), and more specifically to a cooling structure for an LED street lamp whose air-cooling efficiency is markedly improved to achieve high energy efficiency as well as prolonged service life of the LED street lamp.

2. Description of the Related Art

Generally, sodium and mercury light bulbs are widely used in street lamps. Sodium and mercury light bulbs are available in suitable applications based on their inherent advantages and disadvantages. Since light from the conventional light bulbs shows a strong tendency to scatter in all directions, low luminance is inevitable on the ground where light is needed and relatively high power consumption is required, resulting in low energy efficiency.

Under such circumstances, LED street lamps have been developed in recent years. LED street lamps require considerably low power consumption compared to sodium and mercury street lamps and exhibit brightness comparable or superior to conventional street lamps. In addition, the service life of LED street lamps is several times longer than that of sodium and mercury street lamps, resulting in a remarkable reduction in management expense. Based on these advantages, LED street lamps have become increasingly used and are replacing conventional street lamps.

Light emitting diodes currently used in street lamps have the advantage of high luminance. Other advantages of LEDs are low power consumption and long service life when compared to conventional light bulbs. Based on these advantages, the use of LEDs is remarkably increasing in various industrial fields, such as indoor lighting, decorative lighting and automotive lighting systems.

A high level of luminance required in a street lamp cannot be met by the use of a single light emitting diode. In view of high luminance, street lamps are developed using a plurality of light emitting diodes. For example, a lighting lamp with high luminance is manufactured by connecting several to tens of light emitting diodes to one another to construct modules and connecting the modules in series or parallel.

However, when lighting systems comprising modules composed of a plurality of light emitting diodes are turned 'on' for a long time, the light emitting diodes with poor heat resistance are thermally damaged, leading to failure of the lighting systems. Accordingly, lighting systems using LEDs must necessarily be provided with cooling structures to dissipate heat generated from the LEDs. This heat dissipation protects the lighting systems from failure due to overheating. In view of these situations, LED street lamp manufacturers utilize inherent techniques of their own to dissipate heat generated from LEDs.

Numerous cooling structures for LED street lamps have been developed. In a typical cooling structure, light emitting diodes are installed on a partition board made of aluminum with excellent heat dissipation performance to dissipate heat generated during turn-on.

Since the light emitting diodes are directly attached to the aluminum partition board in the cooling structure, heat generated from the LEDs is conducted at a very low rate. In addition, the heat transferred from the LEDs is not rapidly dissipated in the partition board because no cooling means is provided in the partition board, leading to poor cooling efficiency of the cooling structure.

SUMMARY OF THE INVENTION

In accordance with an aspect of the present invention to solve the problems of the prior art, there is provided a cooling structure for a street lamp using light emitting diodes which comprises a heat-dissipating case 5 having an installation portion 5a therein, a printed circuit board 1 installed within the installation portion 5a, one or more light emitting diodes 4 installed under the printed circuit board 1, a heat transfer unit for transferring heat to be generated from the light emitting diodes 4 to the top of the heat-dissipating case 5 and dissipating the heat to the outside, and reflection plates 6 disposed at the bottom of the heat-dissipating case 5. The cooling structure of the present invention is configured to transfer heat generated from the light emitting diodes 4 in an efficient manner to achieve improved heat dissipation efficiency.

In a preferred embodiment, the heat-dissipating case 5 has a plurality of cooling fins 502 formed on the upper surface thereof to achieve improved cooling efficiency.

In a preferred embodiment, the heat transfer unit includes through holes 101 formed in portions of the printed circuit board 1 to which the light emitting diodes 4 are coupled, and heat transfer members 2 filled within the respective through holes 101.

In a preferred embodiment, the heat transfer unit further includes a plurality of heat transfer plates 3 adhered to the upper surfaces of the heat transfer members 2.

In a preferred embodiment, the heat transfer unit further includes a plurality of heat transfer parts 501 connecting the respective heat transfer plates 3 to the upper portion of the heat-dissipating case 5.

In a preferred embodiment, the heat transfer parts 501 are in the form of pillars made of aluminum to achieve efficient heat transfer and effectively support the heat-dissipating case 5 as a whole.

In a preferred embodiment, the heat transfer members 2 may be made of lead (Pb).

In a preferred embodiment, the reflection plates 6 are adhered to the respective light emitting diodes 4 and include reflection portions 601 to reflect light from the light emitting diodes 4 with minimal loss of luminance, thereby ensuring high energy efficiency.

In a preferred embodiment, the angles between the reflection portions 601 are widened downwardly from portions in contact with the light emitting diodes 4 to form flare structures so that optical loss of the light emitting diodes 4 is minimized while efficiently maintaining the luminance of the light emitting diodes 4.

In a preferred embodiment, each of the reflection plates 6 has an outer surface deposited with aluminum to allow light from the light emitting diodes to be efficiently irradiated, minimize loss of luminance and maintain the inherent luminance of the light emitting diodes to the most extent, thus keeping high energy efficiency.

In a preferred embodiment, each of the reflection plates 6 includes a heat-dissipating fin 602 formed between the adjacent reflection portions 601 to more efficiently dissipate heat generated from the light emitting diodes.

In a preferred embodiment, the cooling structure of the present invention further comprises an auxiliary heat-dissipating plate 7 adhered to the upper surface of the heat-dissipating case 5 to achieve enhanced cooling efficiency.

In a preferred embodiment, the cooling structure further comprises a plurality of cooling fins 701 formed on the upper surface of the auxiliary heat-dissipating plate 7 to achieve enhanced cooling efficiency.

In a preferred embodiment, the auxiliary heat-dissipating plate 7 is secured to the heat-dissipating case 5 by screws to facilitate the assembly/disassembly of the heat-dissipating case 5 and the auxiliary heat-dissipating plate 7. Contaminants may be accumulated between the auxiliary heat-dissipating plate 7 and the heat-dissipating case 5 after long-term exposure to the ambient environment to degrade the cooling efficiency of the heat-dissipating case 5. In this case, the auxiliary heat-dissipating plate 7 is disassembled from the heat-dissipating case 5, washed and assembled with the heat-dissipating case 5 to achieve enhanced maintenance and repair efficiency and prevent the cooling efficiency of the heat-dissipating case 5 from degradation.

In a preferred embodiment, the cooling structure of the present invention further comprises a transparent protective cover 8 provided under the heat-dissipating case 5 to protect the surfaces of the light emitting diodes 4 from being contaminated by foreign matters, such as insects.

In a preferred embodiment, the reflection plates 6 have greater vertical lengths than the light emitting diodes 4 so that walkers and drivers are protected from being dazzled by light from the light emitting diodes to allow them to be on their way without any visual disturbance.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention provides an efficiently improved cooling structure for a street lamp using light emitting diodes to quickly and rapidly dissipate heat generated from the light emitting diodes during turn-on so that the street lamp is protected from failure and has greatly improved durability with minimal loss of luminance to achieve enhanced energy efficiency.

The constitution and effects of a cooling structure according to a first embodiment of the present invention will now be described in detail.

Figure 1:
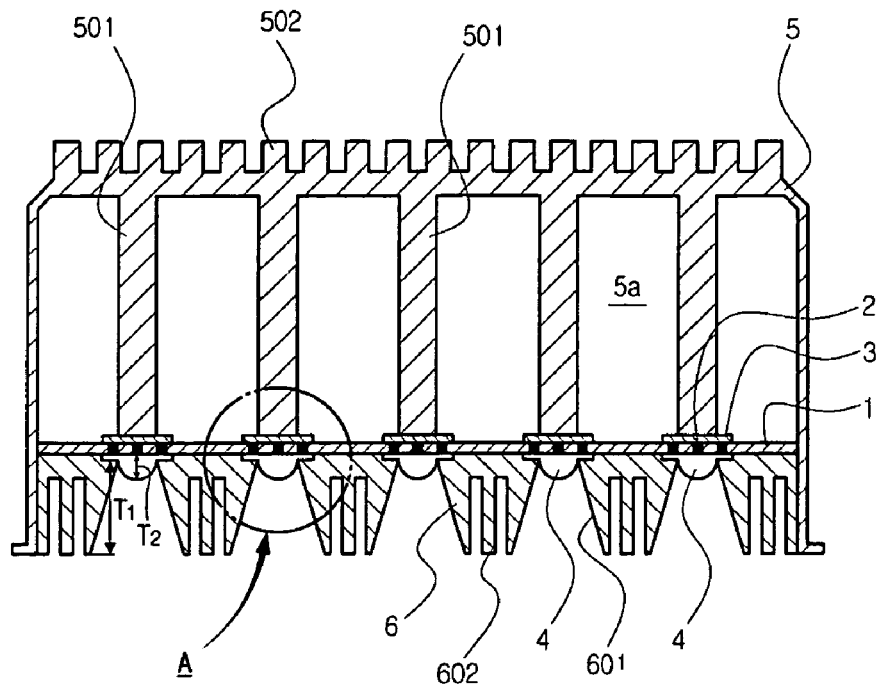
FIG. 1 is a front cross-sectional view illustrating main elements of a cooling structure according to an embodiment of the present invention.
Figure 2:
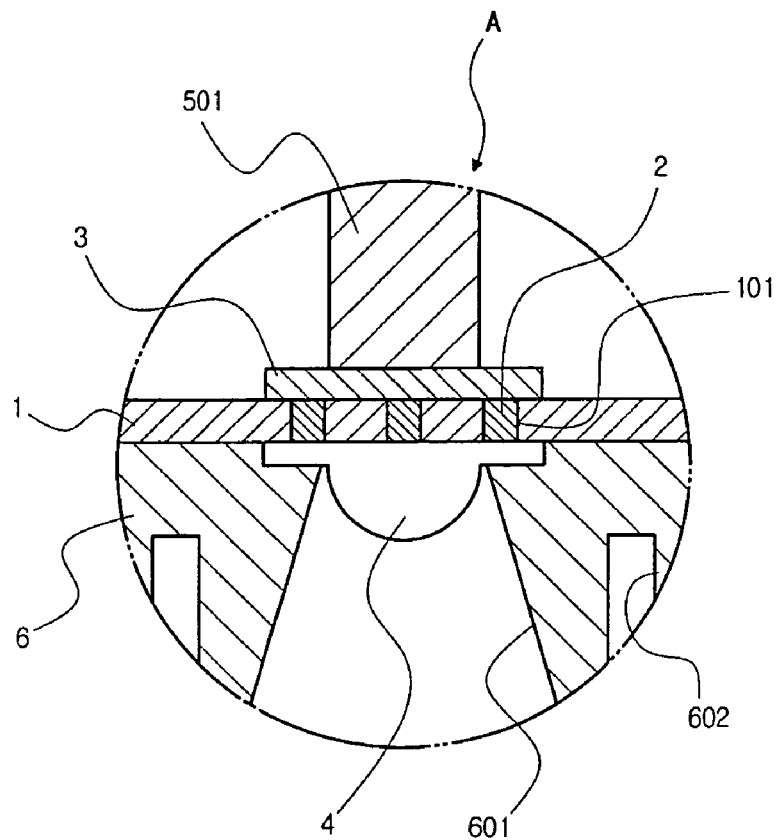
FIG. 2 is an exemplary partially enlarged cross-sectional view of section 'A' of FIG. 1.

FIG. 1 is a front cross-sectional view illustrating main elements of the cooling structure, and FIG. 2 is an exemplary partially enlarged cross-sectional view of section 'A' of FIG. 1.

As illustrated in FIGS. 1 and 2, the cooling structure comprises a heat-dissipating case 5 having an installation portion 5a therein and a plurality of cooling fins 502 formed on the upper surface thereof, a printed circuit board 1 installed within the installation portion 5a, and a plurality of light emitting diodes 4 installed at regular intervals under the printed circuit board 1. With this configuration, heat generated during operation of the light emitting diodes 4 is transferred to the heat-dissipating case 5, where the heat is rapidly dissipated.

Particularly, the cooling structure further comprises a heat transfer unit to dissipate heat generated from the light emitting diodes 4 to the outside. The heat transfer unit includes through holes 101 formed in the printed circuit board 1, heat transfer members 2 filled within the respective through holes 101, heat transfer plates 3 and heat transfer parts 501. The constitution of the heat transfer unit will be described in detail below.

Specifically, the light emitting diodes 4 are installed at regular intervals over the entire surface of the printed circuit board 1.

The through holes 101 are formed in potions of the printed circuit board 1 where the light emitting diodes 4 are installed, and are filled with a highly heat-conductive material (e.g., lead) to form the heat transfer members 2. The heat transfer plates 3 are made of a highly heat-conductive material like the heat transfer members 2. The heat transfer plates 3 are installed on the through holes 101 so as to be adhered to the heat transfer members 2. Heat generated from the light emitting diodes 4 during turn-on is rapidly transferred to the heat transfer plates 3 installed on the upper surface of the printed circuit board 1 via the heat transfer members 2 filled in the respective through holes 101. Particularly, the heat transfer members 2 filled in the respective through holes 101 are preferably made of a highly heat-conductive metal or non-metal. Examples of such metals include copper (Cu), tin (Sn), aluminum (Al) and lead (Pb).

The heat transfer parts 501 protrude integrally in the form of rods within the heat-dissipating case 5, in which the printed circuit board 1 is installed. Accordingly, the printed circuit board 1 is installed within the installation portion 5a of the heat-dissipating case 5 such that the lower surfaces of the heat transfer parts 501 are adhered to the upper surfaces of the heat transfer plates 3 installed on the upper surface of the printed circuit board 1.

Due to this constitution of the cooling structure, heat generated from the light emitting diodes 4 during turn-on is transferred to the heat transfer plates 3 to reach the top of the heat-dissipating case 5 via the heat transfer parts 501 adhered to the upper surfaces of the heat transfer plates 3.

That is, the heat is sequentially transferred to the heat transfer members 2, the heat transfer plates 3 and the heat transfer parts 501 to reach the top of the heat-dissipating case 5. The plurality of cooling fins 502 formed on the upper surface of the heat-dissipating case 5 are exposed to the outside to enable rapid cooling of the heat-dissipating case 5, and as a result, the heat-dissipating case 5 and the light emitting diodes 4 can be prevented from overheating.

The heat conductivity of the printed circuit board 1 is much lower than that of the heat transfer members 2 and heat transfer plates 3. Accordingly, when the heat is transferred to the heat transfer members 2 and the heat transfer plates 3, the printed circuit board 1 and the light emitting diodes 4 can also be prevented from overheating, which causes failure of the light emitting diodes 4 and circuits necessary to turn on the light emitting diodes 4.

Reflection plates 6 are disposed at the bottom of the heat-dissipating case 5.

Specifically, the reflection plates 6 include reflection portions 601 to reflect light from the light emitting diodes 4. The light emitting diodes 4 are fitted between the reflection portions 601 to be brought into close contact with the reflection plates 6.

Heat-dissipating fins 602 are formed between the adjacent reflection portions 601. Heat generated from the light emitting diodes 4 during turn-on is transferred to the reflection plates 6 and is dissipated by the heat-dissipating fins 602 to achieve more efficient heat dissipation.

The reflection portions 601 of the reflection plates 6 are flared. Each of the reflection plates 6 has an outer surface deposited with aluminum to increase the reflectivity of light from the light emitting diodes. This increased reflectivity allows light from the light emitting diodes 4 during turn-on to be efficiently irradiated, which minimizes loss of luminance and maintains the inherent luminance of the light emitting diodes 4 to the most extent to keep high energy efficiency. It is particularly preferable that the vertical lengths $T_1$ of the reflection plates 6 are larger than those $T_2$ of the light emitting diodes 4. That is, the reflection plates are flared to surround the light emitting diodes and prevent unnecessary leakage of light from the light emitting diodes. The street lamp comprising the cooling structure of the present invention is installed on a highway or road to allow a driver to safely drive his/her car at night while ensuring his/her field of vision without any visual disturbance due to dazzling.

Hereinafter, a cooling structure according to a second embodiment of the present invention will be explained with reference to FIG. 3.

Figure 3:
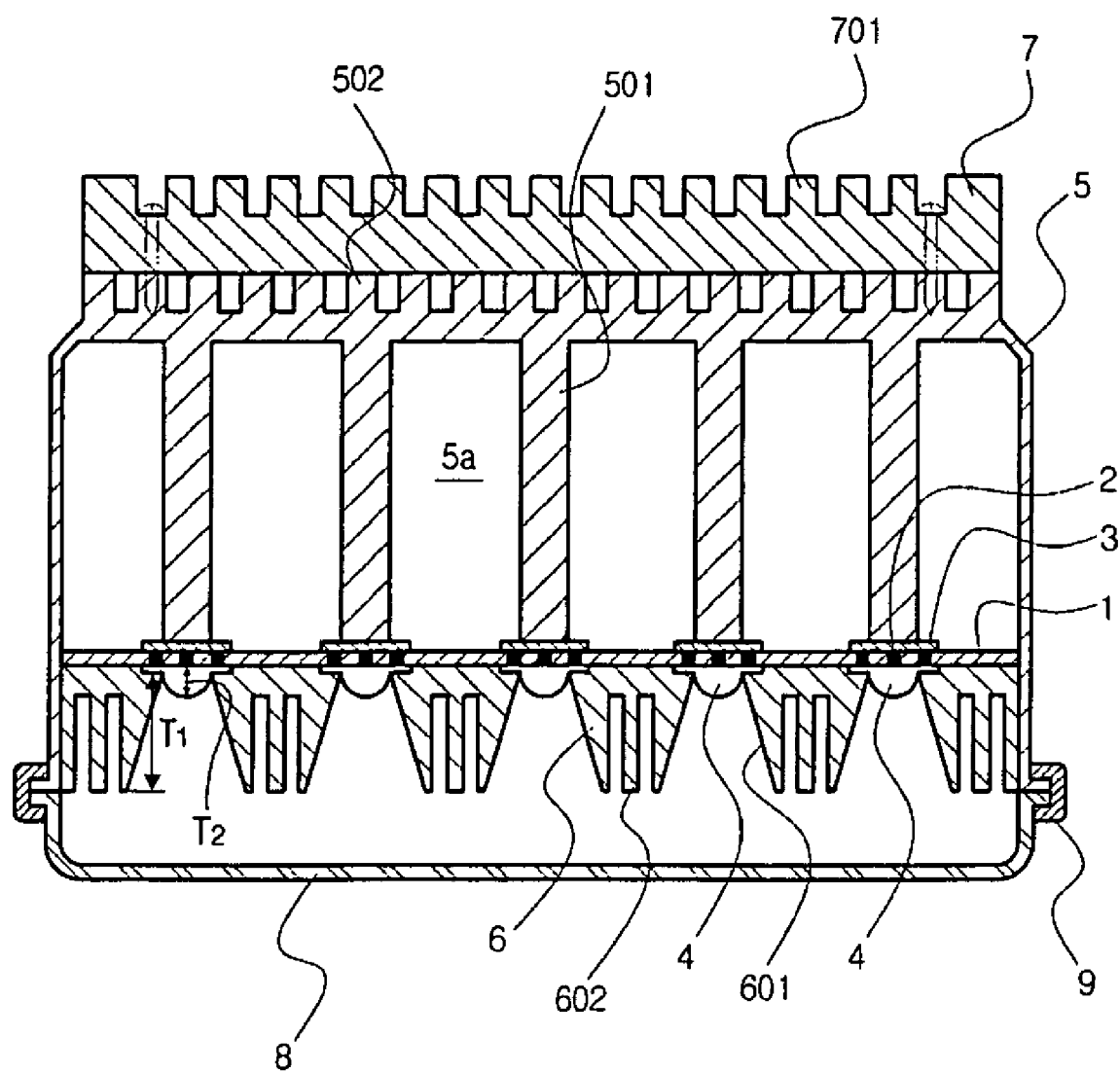
FIG. 3 is an exemplary front cross-sectional view illustrating a cooling structure according to another embodiment of the present invention.

As illustrated in FIG. 3, an auxiliary heat-dissipating plate 7 is coupled to the heat-dissipating case 5 by screws. Due to this screw-coupling, the auxiliary heat-dissipating plate 7 is fastened tightly to the upper surface of the heat-dissipating case 5 to increase the cooling efficiency of the heat-dissipating case 5.

As in the heat-dissipating case 5, a plurality of cooling fins 701 are formed on the upper surface of the auxiliary heat-dissipating plate 7. The auxiliary heat-dissipating plate 7 is made of highly heat-conductive aluminum to rapidly dissipate the heat transferred from the heat-dissipating case 5, achieving enhanced cooling efficiency. In addition, foreign matters, such as dust and contaminants, may be accumulated between the auxiliary heat-dissipating plate 7 and the heat-dissipating case 5 after long-term exposure to the ambient environment to degrade the cooling efficiency of the heat-dissipating case 5. In this case, the auxiliary heat-dissipating plate 7 is disassembled from the heat-dissipating case 5, washed and assembled with the heat-dissipating case 5 to prevent the cooling efficiency of the heat-dissipating case 5 from degradation. Particularly, the separable structure of the auxiliary heat-dissipating plate 7 enables efficient maintenance and repair of the cooling structure.

A transparent protective cover 8 may be fixed under the heat-dissipating case 5 by clips 9. Alternatively, the transparent protective cover 8 may be attached to the heat-dissipating case 5. The protective cover 8 serves to protect the surfaces of the light emitting diodes 4 from being contaminated by foreign matters, such as insects, which cause a reduction in luminance. The use of the clips 9 facilitates the separation of the protective cover 8 from the heat-dissipating case 5, making the cooling structure easy to maintain and repair.

As apparent from the foregoing, the cooling structure of the present invention is efficiently improved to quickly and rapidly dissipate heat generated from the light emitting diodes during turn-on so that the street lamp is protected from failure and has greatly improved durability. In addition, the light emitting structure is improved to inhibit loss of luminance, achieving enhanced energy efficiency and high quality of the street lamp. The street lamp can be installed for general purposes in parks, residential streets, highways, etc., irrespective of places.

Particularly, when the street lamp is installed on a highway or road where high-speed driving is allowed, the reflection plates surrounding the light emitting diodes increases the luminance of the light emitting diodes and prevents light from the light emitting diodes from leakage to protect a driver from being dazzled and allow for his/her safe driving.

What is claimed is:

1. A cooling structure for a street lamp using light emitting diodes, comprising:
    a heat-dissipating case having an installation portion therein and a plurality of cooling fins formed on the upper surface thereof,
    a printed circuit board installed within the installation portion,
    one or more light emitting diodes installed under the printed circuit board,
    a heat transfer unit having through holes formed in portions of the printed circuit board to which the light emitting diodes are coupled, and heat transfer members filled within the respective through holes, and transferring heat to be generated from the light emitting diodes to the top of the heat-dissipating case and dissipating the heat to the outside, and
    reflection plates disposed at the bottom of the heat-dissipating case.

2. The cooling structure according to claim 1, wherein the heat transfer unit further includes a plurality of heat transfer plates adhered to the upper surfaces of the heat transfer members.

3. The cooling structure according to claim 2, wherein the heat transfer unit further includes a plurality of heat transfer parts connecting the respective heat transfer plates to the upper portion of the heat-dissipating case.

4. The cooling structure according to claim 3, wherein the heat transfer parts are in the form of pillars made of aluminum.

5. The cooling structure according to claim 4, wherein the heat transfer members are made of lead (Pb).

6. The cooling structure according to claim 1 or 3, wherein the reflection plates are adhered to the respective light emitting diodes and include reflection portions to reflect light from the light emitting diodes.

7. The cooling structure according to claim 6, wherein the angles between the reflection portions are widened downwardly from portions in contact with the light emitting diodes to form flare structures.

8. The cooling structure according to claim 7, wherein each of the reflection plates has an outer surface deposited with aluminum.

9. The cooling structure according to claim 8, wherein each of the reflection plates includes a heat-dissipating fin formed between the adjacent reflection portions.

10. The cooling structure according to claim 6, further comprising an auxiliary heat-dissipating plate adhered to the upper surface of the heat-dissipating case.

11. The cooling structure according to claim 10, further comprising a plurality of cooling fins formed on the upper surface of the auxiliary heat-dissipating plate.

12. The cooling structure according to claim 11, wherein the auxiliary heat-dissipating plate is secured to the heat-dissipating case by one or more screws.

13. The cooling structure according to claim 6, further comprising a transparent protective cover provided under the heat-dissipating case.

14. The cooling structure according to claim 6, wherein the reflection plates have greater vertical lengths than the light emitting diodes.

* * * * *